(12) United States Patent
Kakikawa et al.

(10) Patent No.: US 7,751,191 B2
(45) Date of Patent: Jul. 6, 2010

(54) TECHNIQUE FOR COOLING A DEVICE

(75) Inventors: Kohichi Kakikawa, Kanagawa (JP); Yohichi Matsui, Tokyo (JP); Hiroyuki Takenoshita, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/192,231

(22) Filed: Aug. 15, 2008

(65) Prior Publication Data

US 2009/0059518 A1    Mar. 5, 2009

(30) Foreign Application Priority Data

Aug. 29, 2007    (JP)    ............... 2007-223142

(51) Int. Cl.
*H05K 7/20*    (2006.01)
*F25B 21/02*    (2006.01)
*H05K 5/00*    (2006.01)

(52) U.S. Cl. ............... 361/702; 62/3.2; 62/3.6; 62/3.7; 454/184; 257/E23.082; 257/930; 361/679.47; 361/679.48; 361/679.5; 361/724

(58) Field of Classification Search ...............
361/679.47–679.48, 679.5, 694, 695, 696–697, 361/702, 724–727; 62/3.6, 3.2, 3.3, 3.7; 454/184; 257/E23.082, 930
See application file for complete search history.

(56) References Cited

U.S. PATENT DOCUMENTS

| 5,467,250 | A  | * | 11/1995 | Howard et al. | ............... 361/696 |
|---|---|---|---|---|---|
| 7,242,580 | B1 | * | 7/2007 | Tanaka | ............... 361/696 |
| 7,325,406 | B2 | * | 2/2008 | Lee et al. | ............... 62/3.2 |
| 2004/0025515 | A1 | * | 2/2004 | Evans | ............... 62/3.2 |
| 2007/0195499 | A1 | * | 8/2007 | Chu | ............... 361/695 |
| 2008/0037217 | A1 | * | 2/2008 | Murakami et al. | ............... 361/695 |

* cited by examiner

*Primary Examiner*—Jayprakash N Gandhi
*Assistant Examiner*—Zachary M Pape
(74) *Attorney, Agent, or Firm*—Matthew C. Zehrer

(57) ABSTRACT

A cooling system that promotes cooling of a device including a heat source therein is provided, the cooling system includes: a cooling unit that absorbs, upstream from the heat source, heat from intake air that the device takes in from an outside to cool the heat source and dissipates the heat to an outside of a flow path of the intake air; and a fluid control unit that lets fluid flow toward the cooling unit so as to discharge the heat absorbed by the cooling unit from the intake air to an outside of the cooling unit.

9 Claims, 5 Drawing Sheets

TECHNIQUE FOR COOLING A DEVICE

FIELD OF THE INVENTION

The present invention relates to a technique for cooling a heat-generating device. More particularly, the present invention relates to a technique for cooling a heat-generating device by fluid.

SUMMARY OF THE INVENTION

A rack-mounted computer system allowing a plurality of high-performance electronic devices to be effectively accommodated therein is widely used. Due to the high performance, an amount of heat generated by such a system tends to be large, and therefore in order to improve the cooling effect by air, such a system comes with a rapidly-rotating fan. As a result, operation sound (noise) therefrom is high. Further, in order to secure high reliability and processing power, such a system is desirably to operate under climate controlled conditions at a low temperature. Thus, in many cases, such a system is installed for operation in a room dedicated to accommodate a computer system that is isolated from a general office.

In recent years, in the field of general clerical work, medical care and the like, a computer is required to have a processing power and reliability higher than before. Therefore, new introduction of the rack-mounted computer system may be encouraged in such fields as well. However, a room dedicated to accommodate such a system cannot be always secured in such a case as well. Then, if such a system is installed in a general office, the office environment may get worse because of noise by the fan or low temperature air-conditioning.

Thus, the present invention provides a cooling system and a method thereof. These cooling system and method are achieved by the combination of the features recited in independent claims of the present invention. Dependent claims thereof specify more advantageous specific examples of the present invention.

In order to cope with the above-stated problems, a first aspect of the present invention provides a cooling system that promotes cooling of a device including a heat source therein, the cooling system including: a cooling unit that absorbs, upstream from the heat source, heat from intake air that the device takes in from an outside to cool the heat source and dissipates the heat to an outside of a flow path of the intake air; and a fluid control unit that lets fluid flow toward the cooling unit so as to discharge the heat absorbed by the cooling unit from the intake air to an outside of the cooling unit. Then, the cooling system may be a system that cools a computer system including an air inlet, the cooling unit may be a cooling plate having one side and the other side, the cooling unit being provided at an edge of the air inlet so that the one side faces the flow path of the intake air taken by the air inlet, the one side being cooled by absorbing heat from the one side and discharging the heat to the other side, and the fluid control unit may let fluid flow along a surface of the other side of the cooling unit so as to be isolated from the intake air, thus discharging the heat absorbed by the cooling unit.

Note that the above brief description of the present invention does not recite all of the necessary features of the present invention, and the sub-combinations of these feature groups also can be inventions.

DETAILED DESCRIPTION OF THE INVENTION

Although the following describes the present invention by way of embodiments, the following embodiments do not limit the invention according to the claims of the present invention, and all of the features described in the embodiments are not always essential to solving means of the present invention.

Figure 1:
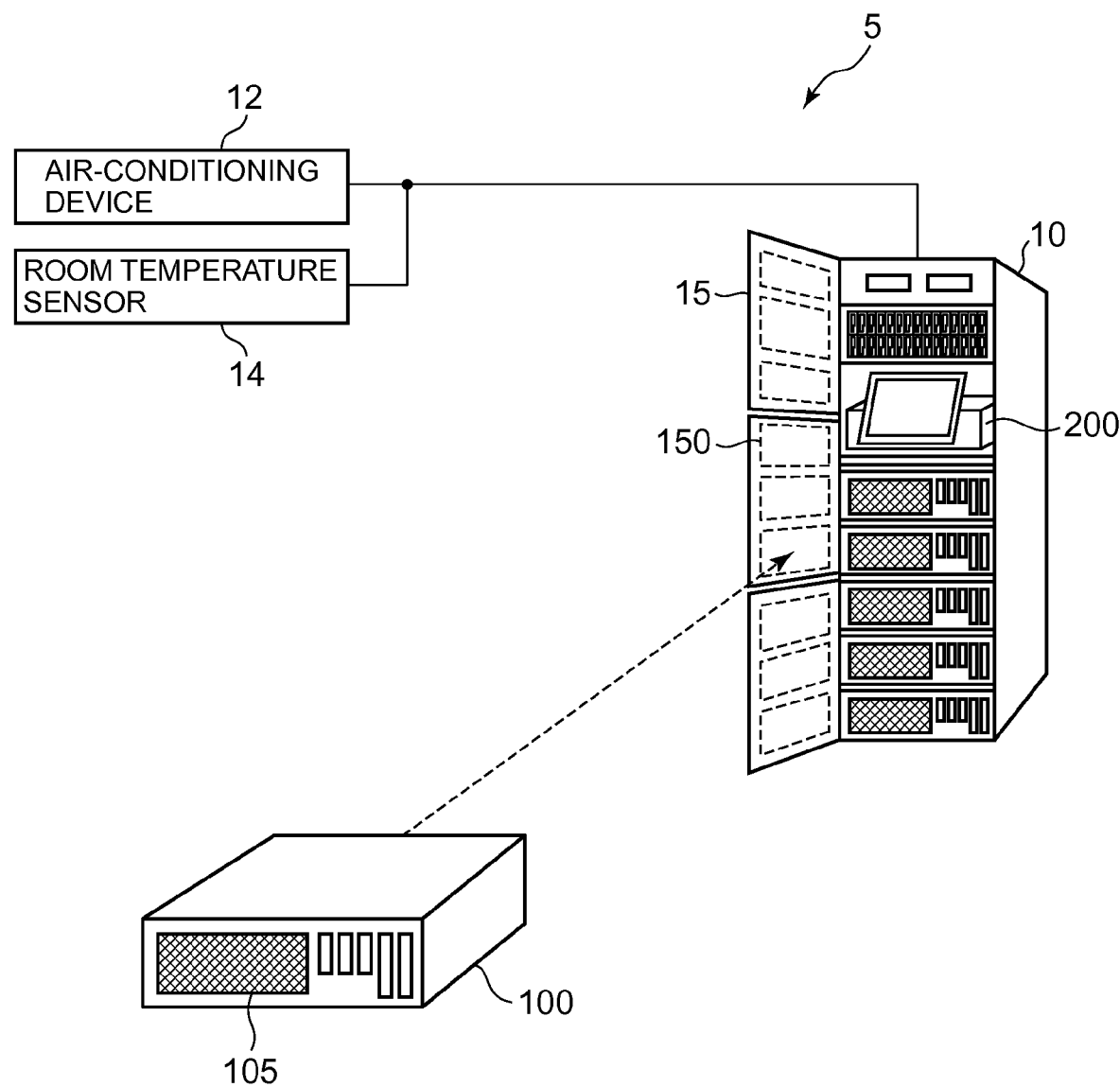
FIG. 1 shows the overall configuration of a cooling system 5 according to the present embodiment.

FIG. 1 shows the overall configuration of a cooling system 5 according to the present embodiment. The cooling system 5 includes a computer system 10, an air-conditioning device 12 and a room temperature sensor 14. The computer system 10 is a rack-mounted system allowing a plurality of devices to be stacked and incorporated therein. At least one of the devices incorporated in the computer system 10 is a heat-generating device due to sophisticated computations such as a computer 100. Therefore, the computer 100 includes an air inlet 105 at a front face thereof, for example, for taking in outside air for cooling the computer 100. The air taken in from the outside is used for cooling the computer 100. More specifically, the intake air is subjected to heat exchange with various heat sources provided inside the computer 100, such as a CPU, a control LSI, a hard disk drive and the like, and is discharged as exhaust air from a rear face of the computer 100. In addition to this or instead of this, the computer system 10 may come with a UPS (uninterruptible power source), a DPU (power source controller) or a storage device (e.g., tape drive) that are stacked therein.

The computer system 10 further incorporates a controller 200 that controls the computer system 10 as a whole. The controller 200 controls, in accordance with an operation by a user, the computer 100 incorporated in the computer system 10. For instance, the controller 200 has a function called a management module that is for controlling the computer system 10 internally so as to reboot a computer 100 that generates a failure and operates abnormally. In addition to this, the controller 200 according to the present embodiment plays a role of appropriately controlling the computer system 10 to cool the same so as to keep the computer system 10 from being at a high temperature, and operating abnormally or breaking. For instance, if the temperature inside one incorporated computer 100 rises above a criterion set beforehand, the controller 200 reduces the load of the computer 100 temporarily. As one example, the controller 200 may reduce an operating frequency of a CPU provided in the computer 100.

Further, in the case where the temperatures inside all of a plurality of incorporated computers 100 rise generally, or in the case where the room temperature measured by the room temperature sensor 14 rises above a predetermined criterion, the controller 200 may instruct the air-conditioning device 12 to cool the air in the room. Thereby, the intake air of the computers 100 can be cooled, so that the inside of the computers 100 can be cooled. In this respect, however, in the case where the computer system 10 is provided in a general office, if the inside of the office is cooled extremely by the air-conditioning device 12, an operator may feel too cold. On the other hand, if the temperature of the room is kept relatively high, the cooling fan provided inside the computer system 10 may rotate rapidly, thus causing noise. To cope with this, in the computer system 10 according to the present embodiment, a plurality of cooling devices 150 for cooling the respective computers 100 individually are provided inside a front cover 15, thus allowing the individual computers 100 to be cooled appropriately and effectively. As a result, there is no need to cool the room as a whole extremely due to some of the computers 100 partially at a high temperature. Further, since the cooling fan is allowed to rotate at an appropriate rate, noise due to the fan also can be reduced. Thereby, it is possible to use the computer system 10 in a general office as well. The following is a detailed description.

Figure 2:
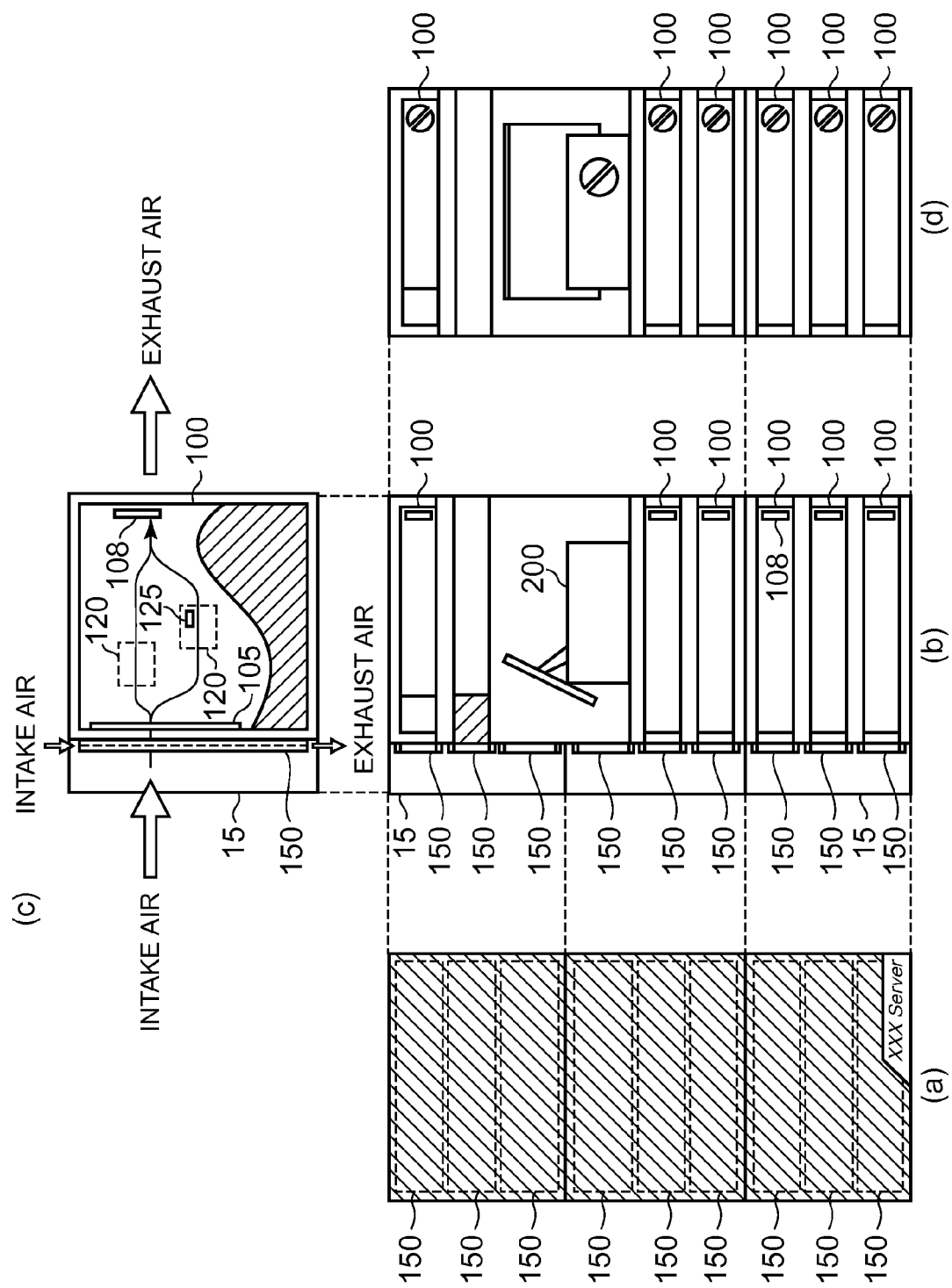
FIG. 2 shows the configuration of the computer system 10 according to the present embodiment in detail.

FIG. 2 shows the configuration of the computer system 10 according to the present embodiment in detail. More specifically, (a) is a partial perspective view showing a front face of the computer system 10 with the front cover 15 being closed, and (b) is a partial perspective view showing a lateral face of the computer system 10 with the front cover 15 being closed. (d) shows a rear face of the computer system 10, and (c) is a partial perspective view showing a top face of the computer system 10 with the front cover 15 being closed. As shown in (b) and (c), the computer system 10 incorporates a plurality of computers 100 and a controller 200 that are stacked therein. Each of the computers 100 may conform to the EIA standard, for example. In this case, a computer 100 is 19 inches (482.6 mm) in width and is an integral multiple of 1.75 inches (44.45 mm) in height, which is different depending on the models. The height of the computer 100 uses this dimension of 1.75 inches called 1 U as the unit, which is called 2 U or 3 U, for example. The computer 100 is not a limiting example, and various devices can be incorporated in the computer system 10 as long as they are devices compliant with such a unified standard.

Further as shown in (a), inside the front cover 15, the plurality of cooling devices 150 are provided so as to correspond to the computers 100, respectively, which are stacked in the computer system 10. Then, as shown in (b) and (c), the respective cooling devices 150 cool the intake air taken by the air inlets 105 in the vicinity of the air inlets 105 of the computers 100 in order to promote the cooling of the corresponding computers 100. Although a specific example of the function of the cooling devices 150 is described later with reference to FIG. 3, the general description thereof is as follows. Each cooling device 150 absorbs heat from air taken inside the computer 100 upstream from the heat sources 120, and dissipates the heat to the outside of a flow path of the intake air. Then, the cooling device 150 causes other fluid (for example, this also may be outside air) to discharge the heat absorbed from the intake air. The other fluid, as shown in (c) for example, flows along the front face of the computer 100 and substantially perpendicularly to the stack direction of the computers 100, and is discharged through a lateral face different from the front face with the air inlet 105 provided therein. This can suppress the exhaust heat of the other fluid from mixing with the intake air, and additionally this can reduce the tendency to disturb the cooling of the other stacked computers 100.

The thus cooled intake air cools the plurality of heat sources 120 provided inside the computer 100, and is discharged from the rear face of the computer 100 by an exhaust air fan 108 as exhaust air. The heat sources 120 may include a measurement unit 125 that measures a temperature inside the computer 100 including the heat sources 120, e.g., a temperature in the vicinity of the heat sources 120. The temperature measured by the measurement unit 125 is sent to the controller 200 by the functions of various hardware/software components such as a controlling BIOS program, an operating system or a communicating device driver. Each of the plurality of computers 100 stacked in the computer system 10 has a substantially same configuration as that of the computer 100 described here as one example. Therefore, the plurality of computers 100 are cooled by their corresponding cooling devices 150, respectively. Further, each of the plurality of computers 100 informs the controller 200 of the temperature measured by the corresponding measurement unit 125 provided therein.

Figure 3:
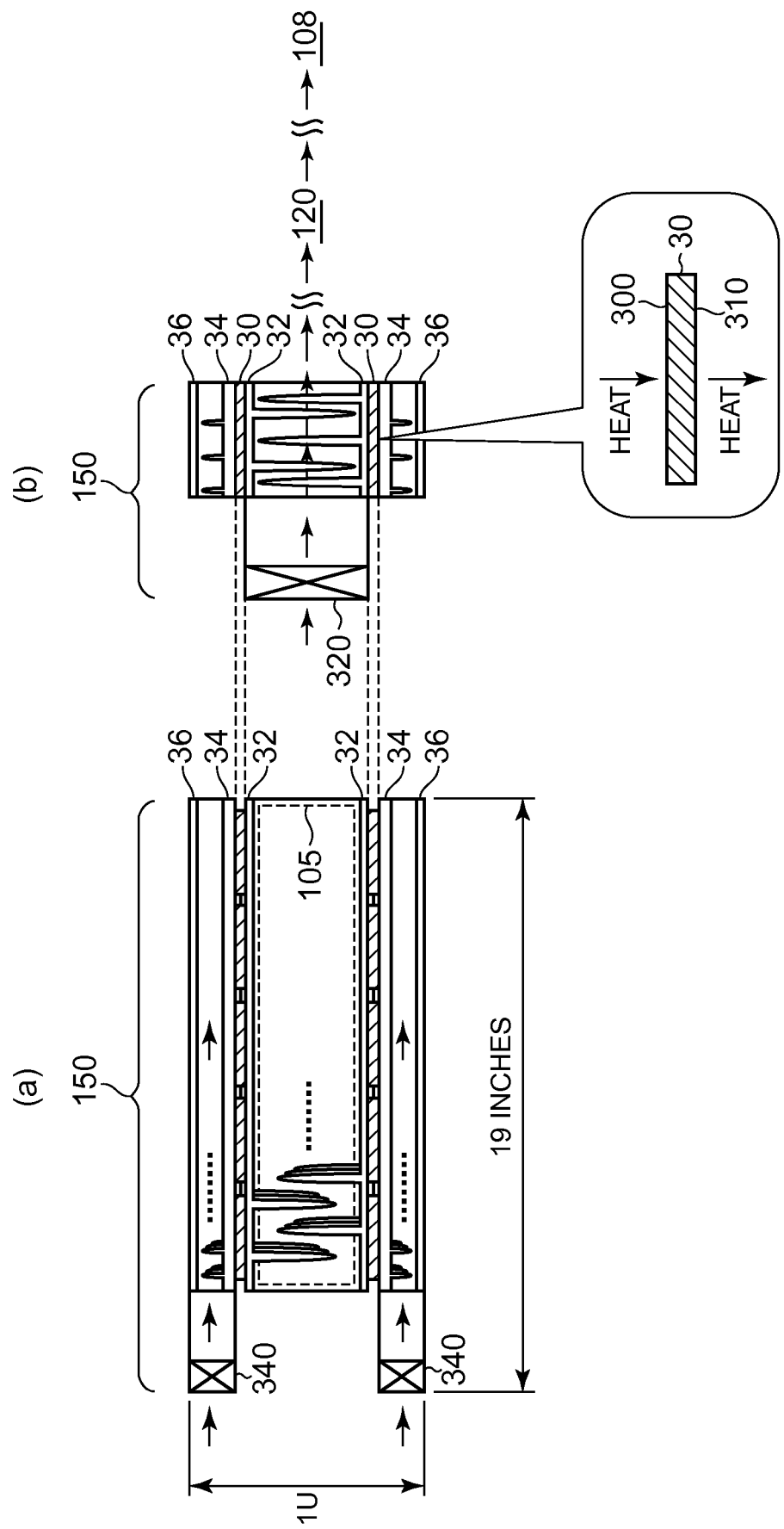
FIG. 3 shows a specific example of the configuration of the cooling device 150 according to the present embodiment.

FIG. 3 shows a specific example of the configuration of the cooling device 150 according to the present embodiment. FIG. 3(*a*) is an enlarged view of the cooling device 150 when viewed from the direction normal to the air inlet 105 of the computer 100, which corresponds to the view point of FIG. 2(*a*). FIG. 3(*b*) is an enlarged view of the cooling device 150 when viewed from the lateral face of the computer system 10, which corresponds to the view point of FIG. 2(*b*). It is desirable that the cooling device 150 has a size enough to cool the computer 100 with 1 U size in height. As one example, the cooling device 150 is about 19 inches in width and about 1.75 inches in height. Alternatively, the height of the cooling device 150 may be equal to the height of the computer 100.

The cooling device 150 includes a Peltier module 30, an intake air fan 320 and an exhaust heat fan 340 as a basic configuration. The Peltier module 30 is one example of a cooling unit according to the present invention, which absorbs heat from the intake air taken inside the computer 100 upstream from the heat sources 120 and dissipates the heat to the outside of a flow path of the intake air. More specifically, the Peltier module 30 is a cooling plate, which is provided at upper and lower edges of the air inlet 105 assuming that the computers 100 are stacked toward an upper direction, and is along the front face of the computer 100 and substantially perpendicularly to the stack direction. Thereby, a substantially linear flow path of the intake air is formed along a surface of one side the Peltier module 30. Then, the Peltier module 30 absorbs heat from the one side and discharges the heat to the other side, thus cooling the one side. Herein, the Peltier module 30 is implemented by connecting a plurality of compact Peltier modules electrically in series or in parallel. In order to further enhance the cooling ability, the Peltier modules 30 may be stacked.

Further, the cooling unit according to the present invention is not limited to the Peltier module, i.e., a member producing the Peltier effect by the movement of electrons or holes, thus moving a heat amount forcibly, as long as it is a cooling plate as stated above. For instance, the cooling unit may include a cooling element based on an air-compressor system or a heat-pump system that can produce a temperature change by repeating the compression and release of gas. In the present embodiment, however, the Peltier module is preferably used because it can eliminate a cooling medium or the like, can realize the accurate temperature setting, and an area required for installing the Peltier module 30 can be made small. Hereinafter, the one side that is cooled by the cooling unit will be called a heat-absorption side 300 and the other side to which heat is dissipated will be called a heat-dissipation side 310.

The intake air fan 320 lets outside air flow into a surface of the heat-absorption side 300 of the Peltier module 30 toward the air inlet 105. Thereby, the cooled outside air can be taken in the computer 100. Meanwhile, the exhaust heat fan 340 plays a role of a fluid control unit according to the present invention together with a guide 36, and when outside air is allowed to flow toward the Peltier module 30, the exhaust heat fan 340 causes the heat absorbed from the intake air by the Peltier module 30 to be discharged to the outside of the Peltier module 30.

The guide 36 forms a substantially linear flow path of the outside air over the surface of the heat-dissipation side 310 of the Peltier module 30 so as to be isolated from the flow path of the intake air. More specifically, the guide 36 is provided for letting the outside air flow along the front face of the computer 100 and substantially perpendicularly to the stack direction of the computers 100, while being isolated from the intake air. Then, the exhaust heat fan 340 lets the intake outside air flow into the guide 36. That is, the outside air flows over the surface of the heat-dissipation side 310 from one end to the other end of the heat-dissipation side 310 along the face of the computer 100 and substantially perpendicularly to the stack direction of the computers 100.

This flow path of the outside air formed by the guide 36 is preferably placed at a skew position with respect to the flow path of the intake air along the surface of the heat-absorption side 300 of the Peltier module 30 so as not to be in parallel and intersect the flow path of the intake air. More preferably, the flow path of the outside air formed by the guide 36 is substantially orthogonal to the flow path of the intake air along the surface of the heat-absorption side 300 with the Peltier module 30 therebetween. In other words, an image obtained by projecting a straight line indicating the flow path formed by the guide 36 to a plane indicating the Peltier module 30 from the direction normal to the heat-dissipation side 310 is preferably orthogonal to an image obtained by projecting a straight line indicating the flow path of the intake air along the surface of the heat-absorption side 300 to the plane indicating the Peltier module from the direction normal to the heat-absorption side 300. Thereby, after the heat exchange with the heat-dissipation side 310, the outside air will be discharged to a face different from the face with the air inlet 105 provided therein. With this configuration, even when two flow paths of intake air are brought closer to each other in order to miniaturize the cooling device 150, the tendency of heat discharged from the heat-dissipation side 310 to mix with the intake air taken by the air inlet 105 can be reduced.

The cooling device 150 further includes a plurality of heat sinks 32 and a plurality of heat sinks 34. The respective heat sinks 32 are provided on the surface of the heat-absorption side 300 of the Peltier module 30. The heat sink 32 is one example of a heat-exchange unit for intake air according to the present invention, and includes at least one fin along the flow path of the intake air taken by the air inlet 105. More specifically, the heat sink 32 may be made of metal with significantly high thermal conductivity such as aluminum, copper or an alloy of them. Heat conduction is promoted by this metal and the fin increases an area in contact with the intake air, so that the heat sink 32 can promote heat exchange between the intake air and the heat-absorption side 300. Note here that the heat-exchange unit for intake air is not limited to this heat sink and may include a heat pipe containing fluid repeating liquefaction and vaporization therein.

The respective heat sinks 34 are provided on the surface of the heat-dissipation side 310 of the Peltier module 30. The heat sink 34 is one example of a heat-exchange unit for exhaust heat according to the present invention, and includes at least one fin along the flow path of the fluid flowed by the exhaust heat fan 340. More specifically, the heat sink 34 may be made of metal with significantly high thermal conductivity such as aluminum, copper or an alloy of them. Heat conduction is promoted by this metal and the fin increases an area in contact with the intake air, so that the heat sinks 34 can promote heat exchange between the intake air and the heat-dissipation side 310. Note here that the heat-exchange unit for exhaust heat is not limited to this heat sink and may include a heat pipe containing fluid repeating liquefaction and vaporization therein.

Note here that the configuration of the cooling device 150 shown in FIG. 3 is one example, and it will be appreciated for a person skilled in the art that such a configuration can be modified in various ways or alternative embodiments can be used without departing from the scope of the present invention. For instance, the location of the Peltier module 30 is not limited at the upper or lower edge of the air inlet 105 assuming that the computers 100 are stacked toward an upper direction, and the Peltier module 30 may be provided at a lateral-side edge of the air inlet 105 as long as the Peltier module 30 is provided so that the heat-absorption side 300 thereof faces the flow path of the intake air. More specifically, the Peltier module 30 can be provided so as to surround the flow path of the intake air taken by the air inlet 105 in a U shape or in a square shape. However, the Peltier module 30 provided at upper and lower portions of the air inlet 105 can prevent the interference by exhaust heat of the cooling of the other computers 100, and can facilitate the manufacturing of the heat sinks 32 provided on the surface of the heat-absorption side 300. Further, the cooling device 150 may be provided inside the computer 100 as long as it can cool the intake air upstream from the heat sources 120. However, in order to enable an already-existing computer 100 to be used without any design changes, the cooling device 150 is preferably provided outside the computer 100 so as to cool the computer 100 from the outside.

Further, as for the exhaust air emitted through the guide 36 by the exhaust heat fan 340, such exhaust air may be emitted outside the room via a dedicated duct, which is for preventing the mixing of the exhaust air with outside air. In this case, the cooling device 150 further may be provided corresponding to an air outlet instead of the air inlet, so as to cool the exhaust air instead of the intake air. Thereby, the cooling device 150 can suppress an increase in room temperature. Moreover, the exhaust heat fan 340 may let other gas or liquid such as water flow into the guide 36, instead of letting the intake outside air flow into the guide 36. In this case, the guide 36 forms an enclosed space into which these fluids flow. Then, the cooling device 105 further includes a mechanism that cools the fluid discharged from the guide 36 and allows the fluid to circulate into the guide 36. The exhaust heat fan 340 allows the fluid to flow through within the thus formed enclosed space and pass in the vicinity of the surface of the heat-dissipation side 310.

As described above with reference to FIGS. 1 to 3, according to the cooling device 150 of the present embodiment, the intake air that is taken inside the computer 100 for cooling is cooled, and is discharged to the outside of the flow path of the intake air, whereby only the computer system 10 can be cooled effectively without turning up the air-conditioning in the room as a whole. This can eliminate the necessity to operate the intake air fan 320 and the exhaust heat fan 340 at a high speed, thus enabling the reduction of noise due to the fans. Further, the heat absorbed from the intake air is discharged in an appropriate direction so as not to mix it with the intake air, whereby the cooling device 150 can be miniaturized while enhancing the cooling effect of the intake air. Moreover, allowing for the feature of the rack-mounted computer system 10 that a plurality of computers 100 are stacked and incorporated, the respective computers 100 can be cooled individually, while reducing the tendency of the exhaust air from one computer 100 to mix with the intake air of the other computers 100.

Figure 4:
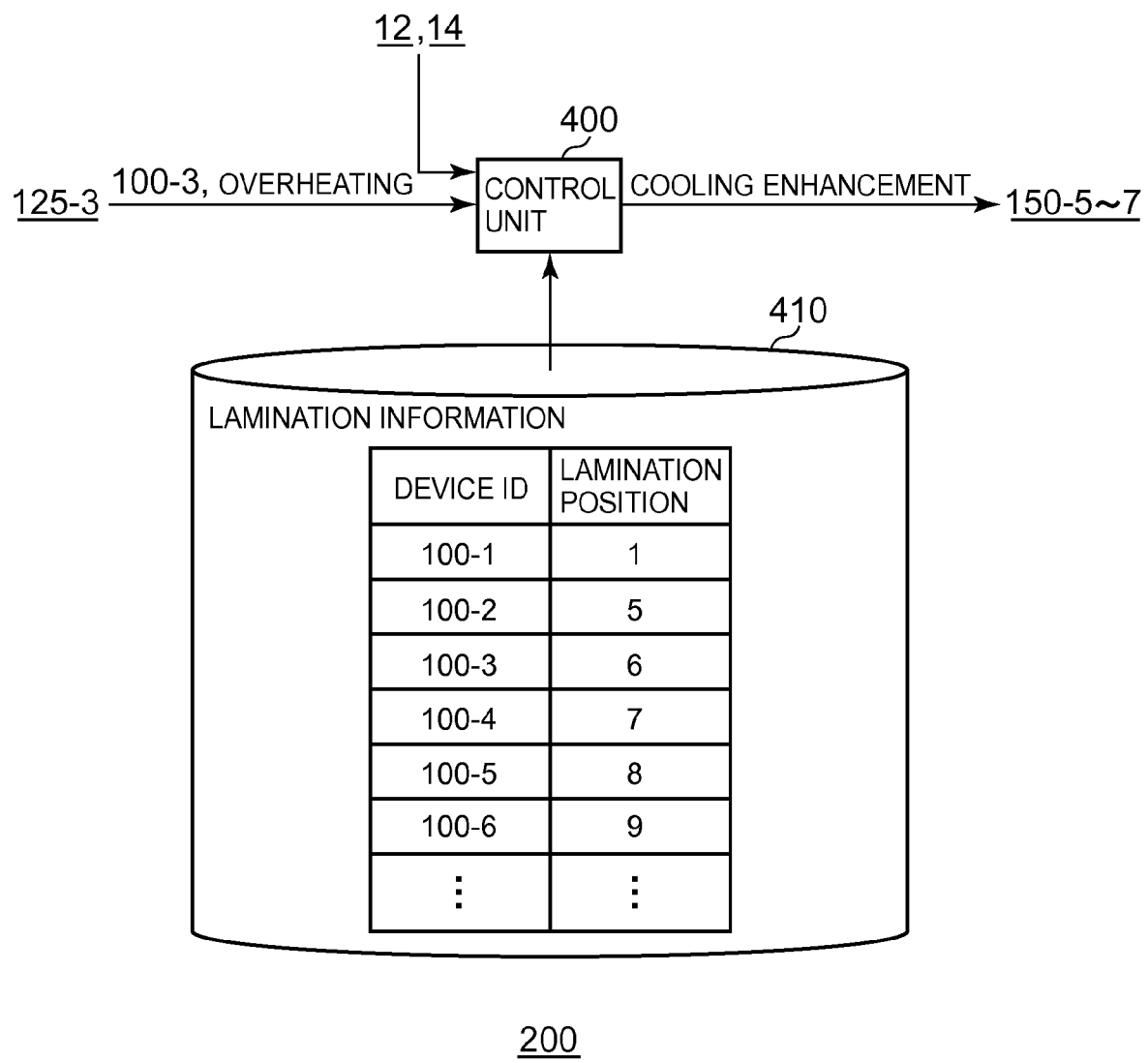
FIG. 4 shows an exemplary functional configuration of the controller 200 according to the present embodiment.

Referring now to FIG. 4, the following describes a specific example where the plurality of cooling devices 150 corresponding to the plurality of computers 100 are controlled individually.

FIG. 4 shows an exemplary functional configuration of the controller 200 according to the present embodiment. The controller 200 includes a control unit 400 and a storage unit 410. The control unit 400 is implemented by the execution of a program by the cooperation of a CPU 1000 and a RAM 1020 described later, for example. The storage unit 410 is implemented by a hard disk drive 1040 described later, for example. In the following description of FIG. 4, the plurality of computers 100 are represented as computers 100-1 to 6 from top to bottom in the stack direction. In the following description, each of the computers 100-1 to 6 has a measurement unit 125, which are represented as the measurement units 125-1 to 6, respectively.

A face of each of the computers 100-1 to 6 is provided with the air inlet 105, which are represented as the air inlets 105-1 to 6, respectively. Not only at the edges of the air inlets 105-1 to 6 but also at the respective stack levels, the cooling devices 150 are provided, which are represented as the cooling devices 150-1 to 9. Each of the cooling devices 150-1 to 9 includes the Peltier module 30 and the intake air fan 320. These Peltier modules 30 and intake air fans 320 are represented as the Peltier modules 30-1 to 9 and the intake air fans 320-1 to 9. The computer system 10 further includes the heat sinks 34 through which liquid flows over the surface of the heat-dissipation side 310 of the Peltier modules 30-1 to 9, which are represented as the heat sinks 34-1 to 9.

The control unit 400 receives temperatures of the computers 100-1 to 6 measured by the measurement units 125-1 to 6. For instance, the control unit 400 may receive data indicating the temperatures by the communication with the computers 100-1 to 6 via an exclusive communication interface. Based on these measured temperatures, the control unit 400 selects any one of the air inlets 105-1 to 6 as a target of cooling enhancement. Then, the control unit 400 controls the intensities of the intake air fan 320 letting outside air flow into the selected air inlet 105, the Peltier module 30 provided at an edge of such an air inlet 105 and the exhaust heat fan 340 letting outside air flow into the surface of the heat-dissipation side 310 of such a Peltier module 30.

The storage unit 410 stores stack information indicating at which one of the stack levels in the computer system 10 each of the stacked computers 100-1 to 6 in the computer system 10 is provided. For instance, the storage unit 410 stores a numerical value 1 that indicates the highest level of the stack in the computer system 10 in association with the identification information of the computer 100-1. The storage unit 410 further stores a numerical value 5 indicating the fifth highest level of the stack in the computer system 10 in association with the identification information of the computer 100-2. The storage unit 410 further stores a numerical value 6 indicating the sixth level of the stack in the computer system 10 in association with the identification information of the computer 100-3. The storage unit 410 further stores a numerical value 7 indicating the seventh level of the stack in the computer system 10 in association with the identification information of the computer 100-4. The storage unit 410 further stores a numerical value 8 indicating the eighth level of the stack in the computer system 10 in association with the identification information of the computer 100-5. The storage unit 410 further stores a numerical value 9 indicating the ninth level of the stack in the computer system 10 in association with the identification information of the computer 100-6.

The control unit 400 controls as follows, for example. The control unit 400, based on a temperature acquired from the measurement unit 125-3, judges that the inside of the computer 100-3 is under a high-temperature environment. Herein, the inside of the computer 100-3 under a high-temperature environment refers to the case where the temperature inside the computer 100-3 is higher than a reference temperature set beforehand as well as the case where an increase rate of the temperature inside the computer 100-3 is higher than a reference rate set beforehand and the combination of these cases. In this case, the control unit 400 selects the computer 100-3 and other devices at the stack levels adjacent to the computer 100-3, such as the computer 100-2 and the computer 100-4. Then, the control unit 400 judges the stack positions of these selected computers 100 based on the lamination information. Their lamination positions are found to be from the fifth to the seventh levels. Then, the control unit 400 instructs the cooling devices 150-5 to 7 to increase the intensities of the Peltier modules 30-5 to 7 provided at the fifth to the seventh levels, the intake air fans 320-5 to 7 and the exhaust heat fans 340-5 to 7. In this way, since the control unit 400 understands precisely the stack position of the computer 100-3 whose temperature may be increased, the surrounding thereof can be cooled appropriately.

As a specific method for the control, the control unit 400 may detect a volume of air of the intake air fan 320 based on a sensor of a revolving speed provided at the intake air fan 320, for example, and may adjust the amount of electricity supplied to the intake air fan 320 based on the volume of air. Similarly, the control unit 400 may detect a volume of air of the exhaust heat fan 340 based on a sensor of a revolving speed provided at the exhaust heat fan 340, for example, and may adjust the amount of electricity supplied to the exhaust heat fan 340 based on the volume of air. The control unit 400 further may detect the intensity of the cooling by each of the Peltier modules 30 based on a sensor measuring the temperature of the Peltier module 30 or a sensor of the electricity amount supplied to the Peltier module 30 provided at the Peltier module 30 and may adjust the amount of electricity supplied to the Peltier module 30 based on the intensity.

Note that the above-stated control by the control unit 400 is one example, and the control unit 400 may control other targets based on other information. For instance, the control unit 400 may determine the temperature distribution resulting from a difference in stack position based on the temperatures acquired from the measurement units 125-1 to 6, and may control the Peltier modules 30 or the like based on the distribution. Further, the control unit 400 may adjust the intensity of the air-conditioning device 12 based on a room temperature acquired from the room temperature sensor 14. Further, the control unit 400 may adjust the intensity of the air-conditioning device 12 based on the temperatures acquired from the measurement units 125. Moreover, the control unit 400 may adjust the intensity of a fan provided inside the computer 100. In this way, the effective cooling can be achieved with consideration given to the office environment not only by the individual control of the plurality of cooling devices 150 but also by the control of the entire room environment including the air-conditioning device 12. Thereby, not only the improvement of the office environment but also the reduction of a load on the air-conditioning device 12 and the improvement of energy efficiency can be achieved.

Figure 5:
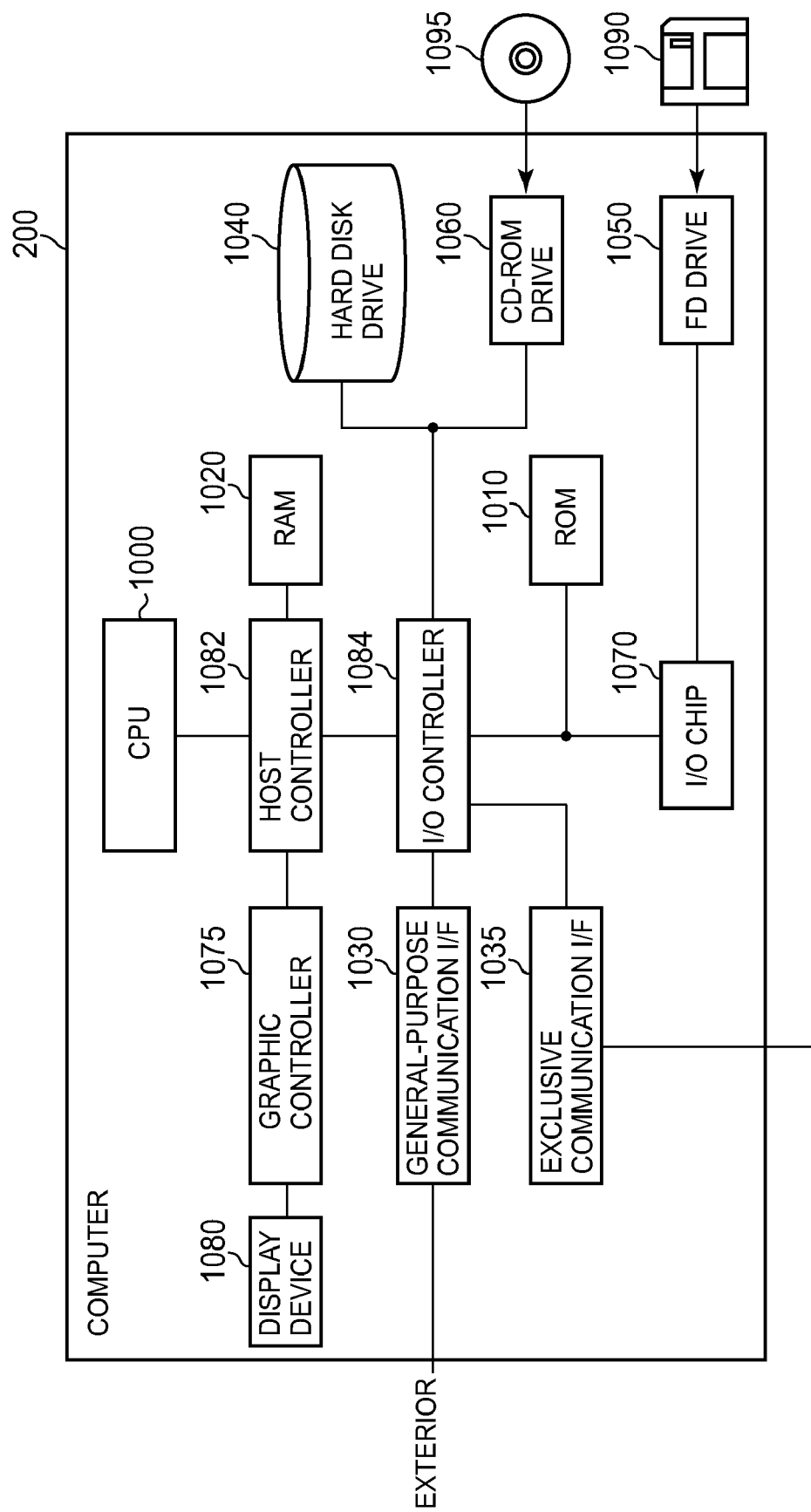
FIG. 5 shows an exemplary hardware configuration of a computer functioning as the controller 200 according to the present embodiment.

FIG. 5 shows an exemplary hardware configuration of a computer functioning as the controller 200 according to the present embodiment. The controller 200 includes the CPU 1000 and the RAM 1020 mutually connected by a host controller 1082, a CPU peripheral section including a graphic controller 1075, a general-purpose communication interface 1030 connected with the host controller 1082 by an input/output controller 1084, an input/output section including a hard disk drive 1040 and a CD-ROM drive 1060, a ROM 1010 connected with the input/output controller 1084, and a legacy input/output section including a flexible disk drive 1050 and an input/output chip 1070.

The host controller 1082 connects the RAM 1020 with the CPU 1000 accessing the RAM 1020 at a high transfer rate and the graphic controller 1075. The CPU 1000 operates in accordance with a program stored in the ROM 1010 and the RAM 1020 to control the respective sections. The graphic controller 1075 acquires image data generated by the CPU 1000 or the like on a frame buffer provided in the RAM 1020 and makes a display device 1080 display the image data. Instead, the graphic controller 1075 may include a frame buffer therein that is for storing image data generated by the CPU 1000 or the like.

The input/output controller 1084 connects the host controller 1082, the general-purpose communication interface 1030 that is a relatively high-speed input/output device, the exclusive communication interface 1035, the hard disk drive 1040 and the CD-ROM drive 1060. The general-purpose communication interface 1030 communicates with external devices via a network. The exclusive communication interface 1035 communicates with the measurement units 125-1 to 6, the cooling devices 150-1 to 9, the air-conditioning device 12, the room temperature sensor 14 and various sensors. The hard disk drive 1040 stores a program and data used by the controller 200. The CD-ROM drive 1060 reads out a program or data from the CD-ROM 1095 and provides the same to the RAM 1020 or the hard disk drive 1040.

The input/output controller 1084 is further connected with the ROM 1010 and relatively low-speed input/output devices such as the flexible disk drive 1050 and the input/output chip 1070. The ROM 1010 stores a boot program that the CPU 1000 executes during start-up of the controller 200, a program depending on the hardware of the controller 200 and the like. The flexible disk drive 1050 reads out a program or data from a flexible disk 1090 and provides the same to the RAM 1020 or the hard disk drive 1040 via the input/output chip 1070. The input/output chip 1070 connects the flexible disk 1090 and various input/output devices via a parallel port, a serial port, a keyboard port, a mouse port or the like.

Programs provided to the controller 200 are stored in a recording medium such as the flexible disk 1090, the CD-ROM 1095, or an IC card and are provided by a user. The programs are read out from the recording medium via the input/output chip 1070 and/or the input/output controller 1084 and are installed in the controller 200 for execution. Since the operations that the programs make the controller 200 or the like execute are the same operation by the controller 200 described referring to FIGS. 1 to 4, the description thereof has been omitted.

The above-stated programs may be stored in an external storage medium. As the storage medium, an optical recording medium such as a DVD or a PD, a magnetooptical recording medium such as a MD, a tape medium, a semiconductor memory such as an IC card and the like are available in addition to the flexible disk 1090 and the CD-ROM 1095. Alternatively, a storage device such as a hard disk or a RAM provided in a server system connected with the exclusive communication network or the Internet may be used as the recording medium, and programs may be provided to the controller 200 via the network.

As stated above, although the present invention has been described by way of embodiments, the technical scope of the present invention is not limited to the above-described embodiments. It will be appreciated for a person skilled in the art that the above-stated embodiments can be modified or improved in various ways. It should be understood that we intend to cover by the appended claims such modified or improved embodiments falling within the technical scope of the present invention.

What is claimed is:

1. A cooling system that promotes cooling of a device including a heat source therein, the cooling system comprising: a cooling unit that absorbs, upstream from the heat source, heat from intake air that the device takes in from outside the device to cool the heat source and dissipates the heat outside of a flow path of the intake air, wherein the cooling unit is a cooling plate having a first side and a second side, the cooling unit being provided at an edge of the air inlet so that the first side faces the flow path of the intake air taken by the air inlet, the second side being cooled by absorbing heat from the first side, discharging the heat to the second side, and discharging the heat to a fluid flow, a fluid control unit that lets the fluid flow toward the cooling unit so as to discharge the heat absorbed by the cooling unit; wherein the cooling system is a system that cools a computer system including an air inlet, and wherein the fluid control unit lets fluid flow along a surface of the second side of the cooling unit so as to be isolated from the intake air, thus discharging the heat absorbed by the cooling unit.

2. The cooling system according to claim 1,
wherein the cooling unit is provided so as to form a substantially linear flow path of the intake air along a surface of the first side,
the fluid control unit includes a guide forming a substantially linear flow path of the fluid along the surface of the second side of the cooling unit so as to be isolated from the flow path of the intake air, and
the flow path of the fluid formed by the guide is placed at a skew position with respect to the flow path of the intake air along the surface of the first side of the cooling unit so as not to be in parallel with and intersect the flow path of the intake air.

3. The cooling system according to claim 2, wherein the flow path of the fluid formed by the guide is substantially perpendicular to the flow path of the intake air with the cooling unit therebetween.

4. The cooling system according to claim 2,
wherein the computer system is a rack-mounted system incorporating a plurality of stacked devices,
the air inlet is provided at a side face of at least one of the plurality of devices,
the cooling unit is provided at an upper or a lower edge assuming that the devices are stacked toward an upper direction, and is provided along the side face of the at least one device and substantially perpendicular to the stack direction, and
the fluid control unit lets fluid flow over the surface of the second side of the cooling unit from one end to the other end of the second side and along the side face of the at least one device and substantially perpendicular to the stack direction.

5. The cooling system according to claim 4, wherein the air inlet takes in outside air to cool the at least one device, and the fluid control unit takes in outside air, lets the outside air flow over the surface of the second side of the cooling unit, and discharges the fluid formed by the guide.

6. The cooling system according to claim 4, further comprising:
a heat-exchange unit for intake air that is provided on the surface of the first side of the cooling unit so as to promote heat exchange between intake air taken by the air inlet and the first side, and
a heat-exchange unit for exhaust heat that is provided on the surface of the second side of the cooling unit so as to promote heat exchange between the fluid flowed by the fluid control unit and the second side.

7. The cooling system according to claim 6, further comprising an intake air fan that lets outside air flow into the air inlet,
wherein the cooling unit is a Peltier module,
the heat-exchange unit for intake air is a heat sink including at least one fin along the flow path of the intake air taken by the air inlet,
the heat-exchange unit for exhaust heat is a heat sink including at least one fin along the flow path of the fluid, and
the guide of the fluid control unit lets outside air pass over the surface of the second side of the cooling unit and along the side face of the at least one device, and the fluid control unit further comprises an exhaust heat fan that cools the second side by letting outside air flow into the guide.

8. The cooling system according to claim 7, wherein a side face of each of the plurality of devices includes the air inlet, the cooling unit is provided at an edge of each of the plurality of air inlets, and the fluid control unit lets fluid flow over a surface of the second side of the cooling unit, wherein the cooling system further comprises: a measurement unit that measures a temperature inside each of the plurality of devices; and a control unit that controls, based on temperatures of the plurality of devices that the measurement unit measures, intensities of the intake air fan that lets outside air flow into any one of the plurality of air inlets, the cooling unit provided at an edge of the air inlet, and the exhaust heat fan that lets outside air flow onto the surface of the second side of the cooling unit.

9. The cooling system according to claim 8, further comprising:
a storage unit that stores stack information indicating at which one of stack levels of the computer system each of the plurality of devices stacked in the computer system is provided,
wherein if a temperature of any one of the plurality of devices measured by the measurement unit exceeds a reference temperature set beforehand, the control unit selects the device and other devices at stack levels adjacent to the device based on the stack information, and increases intensities of the cooling unit, the intake air fan and the exhaust heat fan corresponding to each of the selected devices.

* * * * *